US007871758B2

United States Patent
Misumi et al.

(10) Patent No.: US 7,871,758 B2
(45) Date of Patent: Jan. 18, 2011

(54) PROCESS FOR PRODUCING RESIST PATTERN AND CONDUCTOR PATTERN

(75) Inventors: Koichi Misumi, Kawasaki (JP); Koji Saito, Kawasaki (JP); Kaoru Ishikawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 656 days.

(21) Appl. No.: 11/720,176

(22) PCT Filed: Nov. 29, 2005

(86) PCT No.: PCT/JP2005/022255

§ 371 (c)(1), (2), (4) Date: Nov. 13, 2007

(87) PCT Pub. No.: WO2006/059757

PCT Pub. Date: Jun. 8, 2006

(65) Prior Publication Data

US 2008/0131819 A1  Jun. 5, 2008

(30) Foreign Application Priority Data

Nov. 30, 2004  (JP) .............................. 2004-347772

(51) Int. Cl.
*G03F 7/26* (2006.01)
(52) U.S. Cl. .................................................... 430/311
(58) Field of Classification Search ................. 430/315, 430/311
See application file for complete search history.

(56) References Cited

U.S. PATENT DOCUMENTS

| 2002/0086934 A1* | 7/2002 | Kawaguchi et al. ......... 524/544 |
| 2003/0087187 A1 | 5/2003 | Saito et al. |
| 2003/0176044 A1* | 9/2003 | Park .......................... 438/443 |

FOREIGN PATENT DOCUMENTS

| JP | 2003-140347 | 5/2003 |
| WO | WO 03/036387 A2 | 5/2003 |

OTHER PUBLICATIONS

Combined Office Action and Search Report issued in the counterpart Taiwanese Patent Application No. 094141756, dated Dec. 15, 2008.
International Search Report and Written Opinion from PCT/JP2005/022255 filed on Nov. 29, 2005.

* cited by examiner

*Primary Examiner*—Kathleen Duda
*Assistant Examiner*—Caleen O Sullivan
(74) *Attorney, Agent, or Firm*—Knobbe, Martens, Olson & Bear, LLP

(57) ABSTRACT

This process for producing a resist pattern is a process for producing a resist pattern including: the step of laminating (a) a support having an upper surface on which copper exists, (b) an inorganic substance layer consisting of an inorganic substance supplied from an inorganic substance source, and (c) a photoresist layer consisting of a chemically amplified type negative photoresist composition, to obtain a photoresist laminate, the step of selectively irradiating active light or radioactive rays to the photoresist laminate, and the step of developing the (c) photoresist layer together with the (b) inorganic substance layer to form a resist pattern.

6 Claims, No Drawings

PROCESS FOR PRODUCING RESIST PATTERN AND CONDUCTOR PATTERN

RELATED APPLICATIONS

This application is the U.S. National Phase filing under 35 U.S.C. §371 of PCT/JP2005/022255, filed Nov. 29, 2005, which designated the United States and was published in a language other than English, which claims priority under 35 U.S.C. §119(a)-(d) to Japanese Patent Application No. 2004-347772, filed Nov. 30, 2004. The content of these applications is incorporated herein by reference in their entireties.

TECHNICAL FIELD

The present invention relates to a process for producing a resist pattern and a conductor pattern.

BACKGROUND ART

In recent years, the shift from electric circuits in favor of highly integrated circuits such as LSI etc. has progressed rapidly with the downsizing of electric devices. A multi-pin thin film packaging method of forming contacting terminals, each of which consists of a projected electrode on the upper surface of a support such as a substrate, is applied for mounting LSI etc., on the electric device. In the multi-pin thin film packaging method, a contacting terminal which consists of a bump projecting from the support, or a contacting terminal which consists of a strut called a "metal post" projecting from the support and a solder ball formed thereon, and the like are used.

Such a bump and a metal post can be formed by, for example, the following steps: forming a thick resist layer having a thickness of approximately not less than 5 μm on an upper surface of a support having a part made of copper on the upper surface thereof, preferably a copper substrate, exposing the resist layer through a predetermined mask pattern, developing it to remove (strip) selectively the part which forms the contacting terminal, thereby forming a resist pattern, filling the part stripped (non-resist part) with a conductor such as copper, gold, nickel, solder, etc., by plating or the like, and finally removing the resist pattern therearound.

On the other hand, a chemically amplified type resist composition using an acid generator is well known as a highly sensitive photosensitive resin composition. In the chemically amplified type resist composition, an acid is generated from the acid generator by irradiation with radioactive rays. The chemically amplified type resist composition is designed such that the generation of acid is promoted to change the alkali solubility of the base resin contained in the resist composition, when the chemically amplified type resist composition is heated after being exposed. A composition having a characteristic such that the nature of being insoluble in an alkali can be converted to be soluble in an alkali is called a "positive", whereas a composition having a characteristic such that the nature of being soluble in an alkali can be converted to be insoluble in an alkali is called a "negative". In this way, the chemically amplified type resist composition acquires a remarkably high photosensitivity superior to that of a conventional resist having a photoreaction coefficient (reaction per 1 photon) of less than 1.

However, hitherto if a photoresist layer is formed on a support which contains copper, using a chemically amplified type resist composition, the copper has the effect of making it difficult to obtain a resist pattern with high accuracy. For example, defects such as film stripping or dropping out may be generated on the resist pattern after being developed.

Then, Patent document 1 (Japanese Unexamined Patent Application, First Publication No. 2003-140347) discloses a technology of laminating a support, and a thick photoresist layer containing a resin of which alkali solubility is changed by an effect of an acid and an acid generator, there being an intervening shielding layer which is constituted from an organic material therebetween for preventing contact between the support and the thick photoresist layer.

However, there is a problem in that the time, the temperature, and the like in the production of the shielding layer must be strictly managed and controlled, because the shielding layer is made from an organic material, and hence the conditions for drying it may differ depending on the thickness, the material, the structure and the like of the under layer of the support.

In addition, mixing of the shielding layer and the photoresist layer may be a problem, in the case in which the shielding layer is made from an organic material. Here, the term "mixing" indicates a phenomenon whereby each of two adjoining layers dissolves to be mixed with each other at the interface therebetween when two or more of layers are laminated.

The present invention was made in view of the above circumstances. It is an object of the present invention to provide a process for forming a resist pattern on a support which has copper on the upper surface thereof, which is capable of reducing the effect of the copper on the resist pattern, easy to control and manage production, and hardly generates the problem of mixing.

DISCLOSURE OF THE INVENTION

In order to attain the above object, the present invention adopted the following constitution.

The process for producing a resist pattern of the present invention includes: the step of laminating (a) a support having an upper surface on which copper exists, (b) an inorganic substance layer consisting of an inorganic substance supplied from an inorganic substance source, and (c) a photoresist layer consisting of a chemically amplified type negative photoresist composition, to obtain a photoresist laminate, the step of selectively irradiating active light or radioactive rays to said photoresist laminate, and the step of developing said (c) photoresist layer together with said (b) inorganic substance layer to form a resist pattern.

The process for producing a conductor pattern of the present invention includes forming a conductive pattern on the non-resist part of the resist pattern obtained by the process for forming a resist pattern of the present invention.

EFFECT OF INVENTION

In the present invention, it is possible to provide a process for forming a resist pattern on a support which has copper on the upper surface thereof, which is capable of reducing the effect of the copper on the resist pattern, easy to control and manage production, and hardly generates the problem of mixing.

BEST MODE FOR CARRYING OUT THE INVENTION

Manufacturing Method of a Resist Pattern

The process for producing a resist pattern of the present invention is a process for producing a resist pattern including:

the step of laminating (a) a support having an upper surface on which copper exists, (b) an inorganic substance layer consisting of an inorganic substance supplied from an inorganic substance source, and (c) a photoresist layer consisting of a chemically amplified type negative photoresist composition, to obtain a photoresist laminate, the step of selectively irradiating active light or radioactive rays to said photoresist laminate, and the step of developing said (c) photoresist layer together with said (b) inorganic substance layer to form a resist pattern.

(Laminating Step)

In the laminating step, it is preferable to produce a laminate by forming (b) an inorganic substance layer (it may be referred to as "(b) layer" for convenience) which is supplied from the inorganic substance source between (a) the support ((a) layer) on an upper surface of which copper exists, and (c) the chemically amplified type negative photoresist layer ((c) layer). This will be explained with respect to an example of the method for laminating the (a) layer, the (b) layer, and the (c) layer in this order below.

It should be noted that in the case of laminating the (a) layer, the (b) layer, and the (c) layer, in this way, it is preferred that the (a) layer, the (b) layer, and the (c) layer be laminated in this order, from a lower part toward an upper part.

In addition, it is also possible to dispose an "other layer" between the (a) layer and the (b) layer, or between the (b) layer and the (c) layer. However, this "other layer" preferably has characteristics which are removed upon being developed. As the "other layer", for example, an adhering layer, an anti-reflective layer, a leveling layer, etc. are exemplary.

First of all, the (a) layer is prepared.

The (a) layer is not limited, as long as copper exists on the upper surface (i.e. the surface on which the (c) layer is laminated) of the (a) layer. For example, a copper substrate, a copper sputtered substrate, a support with copper wiring thereon, etc. are exemplary. Preferably, the (a) layer is a copper substrate, or a copper sputtered substrate, having a large influence on the (c) layer due to copper.

The thickness of the (c) layer is not limited particularly, and can be suitably changed depending on use.

Subsequently, the (b) layer is laminated on the upper surface of the (a) layer.

The (b) layer can be formed, by supplying an inorganic substance from the inorganic substance source to the upper surface of the (a) layer.

Here, the inorganic substance source is one which exists independently from the (a) layer. That is, the (b) layer is distinguished from one derived from the material which constitutes the (a) layer. Accordingly, it is possible to form the (b) layer having desired characteristics by using various materials. Specifically, as the inorganic substance source, for example, a plating solution which is applied to plating; electrodeposition solution which is applied to electrodeposition; a target which is applied to PVD (Physical Vapor Deposition), CVD (Chemical Vapor Deposition), sputtering, and vapor deposition etc., are exemplary. That is, as a method for forming the (b) layer by supplying an inorganic substance to the upper surface of the (a) layer from the inorganic substance source, PVD (Physical Vapor Deposition), CVD (Chemical Vapor Deposition), sputtering, vapor deposition, plating, and electrodeposition, etc., are exemplary. Among these, in particular, sputtering method, vapor deposition method, and plating method are preferred, because of the ease of formation. It should be noted that one or more of these methods can be applied in combination.

As the inorganic substance, B, C, Mg, Al, Sc, Ti, V, Cr, Mn, Fe, Co, Ni, Zn, Ge, As, Se, Zr, Nb, Mo, Ru, Rh, Pd, Ag, Cd, In, Sn, Sb, Te, La, Hf, Ta, W, Re, Ir, Pt, Au, Hg, Tl, Pb, Bi, etc. are exemplary. Moreover, an alloy, or an oxide of these inorganic substances, etc. can also be used. Preferably, at least one selected from the group consisting of Al, Zn, Mo, Sn, Pb, and ITO (Indium-Tin Oxide) is used, because of developing performance, and more preferably, the inorganic substance contains Al. In particular, preferably only Al is used. One or more inorganic substances can be used as a mixture.

The (b) layer is preferably formed so that the thickness becomes 0.05 nm to 1 µm, preferably 3 nm to 1 µm, and more preferably 20 nm to 1 µm, considering that the effect of copper of the (a) layer against the (c) layer is screened.

Subsequently, the (c) layer is laminated on the upper surface of the (b) layer.

The chemically amplified type negative photoresist composition is applied onto the (b) layer, and heating (pre-baking) is performed to remove solvent to form a desired coating film. As a method for coating, spin-coating method, roll-coating method, screen-printing method, applicator method, curtain-coating method, etc., can be adopted.

The condition for pre-baking is for approximately 2 to 60 minutes, in general at a temperature of 70 to 150° C., preferably at a temperature of 80 to 140° C., although it differs depending on the kind of each component in the composition, compounding percentage, thickness of the coated film, etc.

As the material for forming the (c) layer, any material can be used with no limitation, as long as it is a chemically amplified type negative photoresist composition.

Especially, a negative photoresist composition which contains (A) a novolac resin, (B) a plasticizer, (C) a crosslinking agent, and (D) an acid generating agent which is disclosed in Japanese Unexamined Patent Application, First Publication No. 2003-43688 is exemplary, as a suitable one because it excels in sensitivity, plating resistivity, and is suitable for forming a thick film desirable for forming bumps.

In this negative resist photoresist composition, it is preferred that the (A) component be an alkali-soluble novolac resin.

Moreover, it is preferred that the (B) component be an alkali-soluble acrylic type resin. Furthermore, it is preferred that the (B) component also be an alkali-soluble vinyl resin. Moreover, it is preferred that the (C) component be an alkoxy methylated amino resin. Furthermore, this alkoxy methylated amino resin is preferably at least one selected from the group consisting of methoxy methylated melamine resin, ethoxy methylated melamine resin, propoxy methylated melamine resin, and butoxy methylated melamine resin. Moreover, it is preferred that the (D) component be a triazine compound.

Hereinafter, the composition of this negative photoresist composition will be explained in detail.

(A) Novolac Resin (A) Novolac resin is preferably one which has alkali solubility.

Such a (A) novolac resin is obtained by, for example, performing addition condensation of an aromatic compound (referred to simply as "phenol" hereinafter) which has a phenolic hydroxyl group, and an aldehyde in the presence of an acid catalyst.

As the phenols used on this occasion, for example, phenol, o-cresol, m-cresol, p-cresol, o-ethylphenol, m-ethylphenol, p-ethylphenol, o-butyl phenol, m-butylphenol, p-butyl phenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone mono-methylether, pyrogallol, fluoroglycinol, hydroxydiphenyl, bisphenol A, gallic acid, gallic acid ester, α-naphthol, β-naphthol, etc. are exemplary.

Moreover, as an aldehyde, for example, formaldehyde, furfural, benzaldehyde, nitrobenzaldehyde, acetaldehyde, etc. are exemplary.

Although the catalyst when performing an addition condensation is not particularly limited, for example, as for an acid catalyst, hydrochloric acid, nitric acid, sulfuric acid, formic acid, oxalic acid, acetic acid, etc. are used.

Although the mass average molecular weight of the (A) novolac resin (MW; measured value by a gel permeation chromatography of polystyrene conversion, and so on) is not particularly limited, 3,000 to 50,000 is preferable.

The above (A) component may be contained within a range of 50 to 95 mass parts, preferably a range of 65 to 80 mass parts to 100 parts of the total amount of the (A) to (D) components. By making the (A) component content to be not less than 50 mass parts, it becomes possible to increase plating solution resistance, shape of the bump, and strippability, and by making the (A) component content to be not less than 90 mass parts, it becomes possible to suppress poor development upon being developed.

(B) Plasticizer

As a (B) plasticizer, polymers having an ethylenic double bond, etc. are exemplary, among them, an acryl type polymer or a vinyl type polymer is preferable.

Hereinafter, examples using an acryl type polymer or a vinyl type polymer as the (B) component will be explained.

In the (B) component, in particular as for an acrylic type polymer, those having alkali solubility are preferable, and further those that contain the constitutional unit derived from the polymerizable compound having an ether bond and the constitutional unit derived from the polymerizable compound having a carboxyl group are preferable.

As the polymerizable compound having an ether bond, a (meth)acrylic acid derivative having an ether bond and an ester bond, such as 2-methoxyethyl (meth)acrylate, methoxytriethylene glycol(meth)acrylate, 3-methoxybutyl(meth)acrylate, ethyl carbitol(meth)acrylate, phenoxypolyethylene glycol (meth)acrylate, methoxy polypropylene glycol (meth) acrylate, tetrahydrofurfuryl(meth)acrylate, and preferably 2-methoxyethylacrylate, and methoxytriethyleneglycolacrylate.

It should be noted that the (meth)acrylate indicates one or both a methacrylate and an acrylate. The (meth)acrylic acid indicates one or both a methacrylic acid and an acrylic acid. Each of these compounds can be used singly or in combination of two or more.

As the polymerizable compound having a carboxyl group, a monocarboxylic acid such as acrylic acid, methacrylic acid, and crotonic acid; a dicarboxylic acid such as maleic acid, fumaric acid, and itaconic acid; a methacrylic acid derivative having a carboxylic acid and an ester bond, such as 2-methacryloyloxyethyl succinic acid, 2-methacryloyloxyethyl maleic acid, 2-methacryloyloxyethyl phthalic acid, 2-methacryloyloxyethylhexahydrophthalic acid, etc., are exemplary, and preferably acrylic acid and methacrylic acid. Each of these compounds can be used singly or in combination of two or more.

The percentage of the polymerizable compound having an ether bond in the acryl type polymer is 30 to 90 mass %, preferably 40 to 80 mass %.

By making the percentage to be not more than 90 mass %, the compatibility to the (A) novolac resin solution can be increased, thereby suppressing generation of Benard cells (network pattern having a pentagonal to heptangular shape with unevenness which generates on the surface of a coated film due to gravity or surface tension slope) in the prebaking step and as a result, a uniform resist film can be obtained. By making the percentage to be not less than 30 mass %, cracking in the plating step can be suppressed.

The percentage of the polymerizable compound having a carboxyl group in the acryl type polymer is 2 to 50 mass %, and preferably 5 to 40 mass %. By making the percentage to be not less than 2 mass %, the alkali solubility of the acryl resin can be increased to obtain sufficient developing ability. Moreover, strippability can be improved and thereby suppressing the resist film remaining on the substrate. By making the percentage to be not more than 50 mass %, the percentage of the resist film remaining after being developed can be increased and thereby increasing the plating resistance.

The mass average molecular weight of the acryl type polymer is 10,000 to 800,000, and preferably 30,000 to 500,000.

By making the mass average molecular weight to be not less than 10,000, the resist film acquires a sufficient strength, thereby suppressing the swelling of the profile and cracking upon being plated. By making the molecular weight to be not more than 800,000, adhesiveness and strippability can be increased.

Furthermore, other radical polymerizable compounds can be contained as a monomer in the acryl type polymer in order to control physical or chemical properties moderately.

Here, the term "other radical polymerizable compounds" means radical polymerizable compounds other than the polymerizable compounds mentioned in the above.

As such a polymerizable compound, a (meth)acrylic acid alkyl ester, such as methyl(meth)acrylate, ethyl(meth)acrylate, butyl(meth)acrylate, etc.; a (meth)acrylic acid hydroxyalkylester, such as 2-hydroxyethyl(meth)acrylate, 2-hydroxypropyl(meth)acrylate, etc.; a (meth)acrylic acid arylester, such as phenyl(meth)acrylate, benzyl(meth)acrylate, etc.; a dicarboxylic acid diester, such as diethyl maleate, dibutyl fumarate, etc.; a vinyl group-containing aromatic compound, such as styrene, α-methyl styrene, etc.; a vinyl group-containing aliphatic compound such as vinyl acetate, etc.; a conjugated diolefin, such as butadiene, isoprene, etc.; a nitrile group-containing polymerizable compound such as acrylonitrile, methacrylonitrile, etc.; a chlorine containing polymerizable compound such as vinyl chloride, vinylidene chloride, etc.; and an amide bond containing polymerizable compound such as acrylamide, methacrylamide, etc. are exemplary. Each of these compounds can be used singly or in combination of two or more. Among these, n-butyl acrylate, benzylmethacrylate, methylmethacrylate, etc. are particularly preferable. The percentage of the other radical polymerizable compounds in the acryl type polymer is preferably less than 50 mass %, more preferably less than 40 mass %.

As a polymerization solvent used in synthesizing the acryl type polymer, for example, alcohols such as ethanol, diethylene glycol, etc.; alkyl ethers of a polyhydricalcohol such as ethyleneglycolmonomethylether, diethyleneglycolmonomethyl ether, diethyleneglycolethylmethylether, etc.; alkylether acetates of a polyhydricalcohol, such as ethyleneglycolethyletheracetate, propyleneglycolmethyletheracetate, etc.; aromatic hydrocarbons, such as toluene, xylene, etc.; ketones such as acetone, methyl isobutyl ketone, etc.; esters such as ethyl acetate, butyl acetate, etc. can be used.

Among these, alkyl ethers of a polyhydricalcohol, and alkyl ether acetates of a polyhydricalcohol are particularly preferable.

As a polymerization catalyst used in synthesizing the acryl type polymer, ordinary radical polymerization initiator can be used, for example, azo compounds such as 2,2'-azobisisobutyronitrile, etc.; organic peroxides, such as benzoyl peroxide, di-t-butylperoxide, etc. can be used.

Moreover, a vinyl type polymer can be preferably used as the (B) component. It should be noted that the vinyl type polymer referred to here is a polymer which is obtained from a vinyl type compound.

For example, polyvinylchloride, polystyrene, polyhydroxystyrene, polyvinyl acetate, polyvinylbenzoicacid, polyvinyl alcohol, polyacrylic acid, polymethacrylic acid, polyacrylate, polymaleicacid imide, polyacrylamide, polyacrylonitrile, polyvinyl phenol, copolymers thereof, etc. are exemplary. Among these resins, those having a carboxyl group or a phenolic hydroxyl group at the side chain or the main chain are capable of being developed in an alkali and hence preferable. Particularly, resins having a carboxyl group are highly developable in an alkali, and hence preferable.

The mass average molecular weight of the vinyl type polymer is 10,000 to 200,000, preferably 50,000 to 100,000.

The above (B) component may be contained in an amount of 5 to 30 mass parts, preferably 10 to 20 mass parts to 100 parts of the total of the (A) to (D) components. By making the (B) component to be not less than 5 mass parts, floating of the resist, cracking etc. in plating can be suppressed, thereby improving the plating solution resistance. Whereas, by making the (B) component to be not more than 30 mass parts, strength of the resist film to be formed can be increased, thereby suppressing the tendency that a fine profile cannot be obtained due to swelling etc. to deteriorate the resolution.

(C) Crosslinking Agent

As the (C) component, amino compounds such as melamine resin, urea resin, guanamine resin, glycoluril-formaldehyde resin, succinylamide-formaldehyde resin, ethylene urea-formaldehyde resins, etc. can be used, however, alkoxy methylated amino resins, such as alkoxy methylated melamine resin and alkoxy methylated urea resin, etc. are especially preferable.

The alkoxy methylated amino resins in the above can be produced by, for example, reacting melamine or urea with formalin in a boiling aqueous solution to obtain a condensate, then etherifying the resultant condensate with lower alkyls such as methyl alcohol, ethyl alcohol, propyl alcohol, butyl alcohol, isopropyl alcohol etc., thereafter cooling the resultant reaction liquid to be deposited.

As the above-mentioned alkoxy methylated amino resin, specifically, methoxy methylated melamine resin, ethoxy methylated melamine resin, propoxy methylated melamine resin, butoxy methylated melamine resin, methoxy methylated urea resin, ethoxy methylated urea resin, propoxy methylated urea resin, butoxy methylated urea resin, etc. are exemplary.

The above-mentioned alkoxy methylation amino resin can be used solely or in combination of two or more thereof.

In particular, alkoxy methylated melamine resin is preferable, because it is possible to produce a resist pattern therewith having a small dimensional changing amount against the change of irradiation amount of radioactive rays and which is stable. Among them, especially, methoxy methylated melamine resin, ethoxy methylated melamine resin, propoxy methylated melamine resin, and butoxy methylated melamine resin are preferable.

The above-mentioned (C) component may be contained in an amount ranging from 1 to 30 mass parts, preferably 5 to 20 mass parts to 100 mass parts of the total amount of the (A) to (D) components. If the (C) component is not less than 1 mass parts, then a thick resist film can be formed, thereby improving the plating resistance, the chemical resistance, and adhesiveness when forming bumps using this component. And as a result, it is possible to obtain bumps having a desired shape. Whereas, if the (C) component is not more than 30 mass parts, the tendency of defects being caused when developing can be suppressed.

(D) An acid generating agent (D) component is not limited especially as long as it is a compound which generates acid directly or indirectly by irradiation with light.

Specifically, a halogen containing triazine compound such as 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, and tris(1,3-dibromopropyl)-1,3,5-triazine, tris(2,3-dibromopropyl)-1,3,5-triazine, and a halogen containing triazine compound expressed by the following formula (3), such as a tris(2,3-dibromopropyl)isocyanate;

[chemical 1]

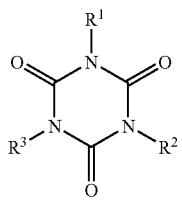

(In the formula, each of $R^1$ to $R^3$ may be either the same or different from each other, and represents a halogenated alkyl group)

α-(p-toluenesulfonyloxyimino)-phenylacetonitrile, α-(benzenesulfonyloxyimino)-2,4-dichlorophenylacetonitrile, α-(benzene sulfonyloxyimino)-2,6-dichlorophenyl acetonitrile, α-(2-chlorobenzenesulfonyloxyimino)-4-methoxyphenylacetonitrile, α-(ethylsulfonyloxyimino)-1-cyclopentenylacetonitrile, and a compound expressed by the following general formula;

[chemical 2]

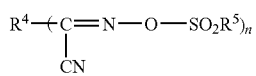

(In the formula, $R^4$ represents monovalent to trivalent organic group, $R^5$ represents a substituted or non-substituted saturated hydrocarbon group, an unsaturated hydrocarbon group, or an aromatic compound group, and n represents a natural number of 1 to 3.)

Here, the aromatic compound group indicates a group of compounds which exhibits physical or chemical characteristics unique to an aromatic compound, for example, an aromatic hydrocarbon group such as phenyl group, naphthyl group, etc., and a heterocyclic group such as furil group, thienyl group, etc., are exemplary. These may have one or more of a suitable substituent on the ring, for example a halogen atom, an alkyl group, an alkoxy group, a nitro group. In addition, $R^5$ is particularly preferably an alkyl group having 1 to 4 carbon atoms, for example, a methyl group, an ethyl group, a propyl group, and a butyl group are exemplary.

The organic group of monovalent to trivalent represented by $R^4$ is preferably an aromatic compound group, in particular, a compound of which $R^4$ is an aromatic compound group and of which $R^5$ is a lower alkyl group is preferable.

As the acid generating agent expressed by the above general formula, one $R^4$ which is any one of a phenyl group, methylphenyl group, methoxyphenyl group, when n=1, and $R^5$ is a methyl group, specifically, α-(methylsulfonyloxyimino)-1-phenylacetonitrile, α-(methylsulfonyloxyimino)-1-(p-methylphenyl)acetonitrile, and α-(methylsulfonyloxyimino)-1-(p-methoxyphenyl)acetonitrile are exemplary. As the acid generating agent expressed by the above general formula when n=2, specifically, the acid generating agent expressed by the following formula is exemplary:

[chemical 3]

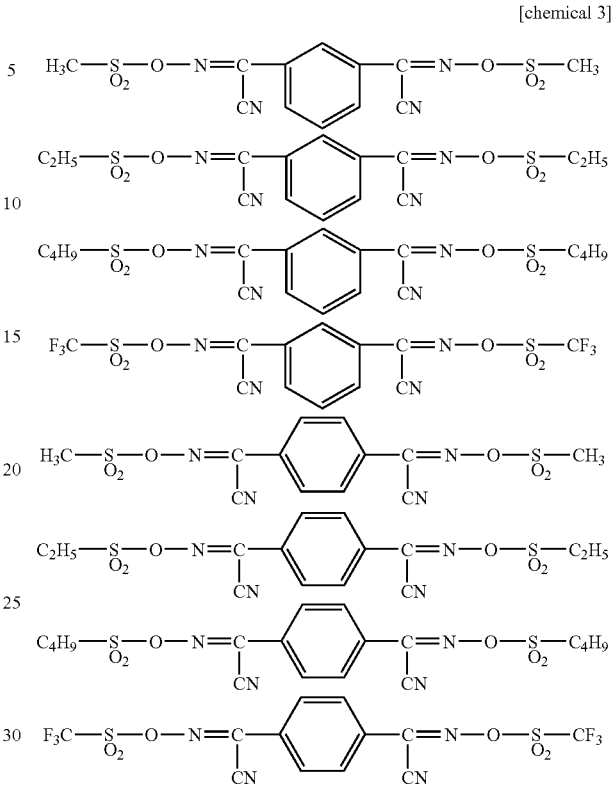

a bissulfonyldiazomethane, such as bis(p-toluenesulfonyl) diazomethane, bis(1,1-dimethylethylsulfonyl)diazomethane, bis(cyclohexylsulfonyl)diazomethane, bis(2,4-dimethylphenylsulfonyl)diazomethane, etc.; a nitrobenzyl derivative such as p-toluenesulfonic acid 2-nitrobenzyl, p-toluenesulfonic acid 2,6-dinitrobenzyl, nitrobenzyltosylate, dinitrobenzyltosylate, nitrobenzylsulfonate, nitrobenzylcarbonate, dinitrobenzylcarbonate, etc.; a sulfonate such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, N-methylsulfonyloxyphthalimide, etc.; an onium salt, such as diphenyliodoniumhexafluorophosphate, (4-methoxyphenyl)phenyliodoniumtrifluoromehanesulfonate, bis(p-tert-butylphenyl)iodoniumtrifluoromethanesulfonate, triphenylsulfoniumhexafluorophosphate, (4-methoxyphenyl)diphenylsulfoniumtrifluoromethane sulfonate, (p-tert-butylphenyl)diphenylsulfoniumtrifluoromethane sulfonate, etc.; a benzointosylate, such as benzointosylate, α-methylbenzointosylate, etc.; other diphenyl iodonium salts, a triphenylsulfonium salt, a phenylziazonium salt, a benzylcarbonate, etc. are exemplary.

Particularly triazine compounds are preferable because which have a high performance as the acid generating agent by lights, and which exhibit excellent solubility even when using a solvent. Among them, a bromo containing triazine compound, in particular, 2,4-bis-trichloromethyl-6-(3-bromo-4-methoxyphenyl-s-triazine, 2,4-bis-trichloromethyl-6-(3-bromo-4-methoxy) styryl-s-triazine, and tris (2,3-dibromo propyl) isocyanate are preferable.

The above-mentioned (D) component may be contained in an amount ranging 0.01 to 10 mass parts, preferably ranging 0.05 to 2 mass parts, more preferably ranging 0.1 to 1 mass parts to 100 parts of the total of the (A) to (D) components. If the (D) component is not less than 0.01 mass parts, then cross-linking and hardening by heat or lights are performed sufficiently in case of forming a thick film to increase the plating resistance, the chemical resistance and adhesiveness of the resultant thick film. Moreover, the shape of the bump to be formed can be a desirable one. Whereas, by making the (D) component to be not more than 5 mass parts, the developing defect when developing can be suppressed.

Furthermore, organic solvents may be suitably compounded in the negative photoresist composition for adjusting the viscosity. As the above-mentioned organic solvent, specifically, ethylene glycol monomethyl ether, ethylene glycol monoethyl ether, ethylene glycol mono-propyl ether, ethylene glycol mono-butyl ether, ethylene glycol dimethyl ether, ethylene glycol diethyl ether, ethylene glycol dipropyl ether, propylene glycol monomethyl ether, propylene glycol monoethyl ether, propylene glycol mono-propyl ether, propylene glycol mono-butyl ether, propylene glycol dimethyl ether, propylene glycol diethyl ether, diethylene glycol monomethyl ether, diethylene glycol monoethyl ether, diethylene glycol mono-phenyl ether, diethylene glycol dimethyl ether, diethylene glycol diethyl ether, ethylene-glycol-monomethyl-ether acetate, ethylene glycol monoethyl ether acetate, ethylene glycol monopropyl ether acetate, ethylene glycol mono-butyl ether acetate, ethylene glycol mono-phenyl ether acetate, diethylene glycol-monomethyl-ether acetate, diethylene glycol-monoethyl-ether acetate, diethylene glycol monopropyl ether acetate, diethylene glycol monobutyl ether acetate, diethylene glycol mono-phenyl ether acetate, propylene glycol-monomethyl-ether acetate, propylene glycol mono-ethyl ether acetate, propylene glycol monopropyl ether acetate, 2-methoxybutyl acetate, 3-methoxybutyl acetate, 4-methoxybutyl acetate, 2-methyl3-methoxybutyl acetate, 3-methyl-3-methoxybutyl acetate, 3-ethyl-3-methoxybutyl acetate, 2-ethoxy butyl acetate, 4-ethoxybutyl acetate, 4-propoxybutyl acetate, 2-methoxypentyl acetate, 3-methoxy pentyl acetate, 4-methoxy pentyl acetate, 2-methyl-3-methoxy pentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclohexanone, methyl propionate, ethyl propionate, propyl propionate, isopropyl propionate, 2-hydroxy methyl propionate, 2-hydroxy ethyl propionate, 2-hydroxy-2-methyl, methyl-3-methoxypropionate, ethyl-3-methoxypropionate, ethyl-3-ethoxy propionate, ethyl-3-propoxy propionate, propyl-3-methoxypropionate, isopropyl-3-methoxypropionate, ethoxyethyl acetate, oxy ethyl acetate, 2-hydroxy-3-methyl butanoic acid methyl, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl methyl ether, benzyl ethyl ether, dihexyl ether, benzyl acetate, benzoic ethyl, oxalic ester, diethyl maleate, γ-butyrolactone, benzene, toluene, xylene, cyclohexanone, methanol, ethanol, propanol, butanol, hexanol, cyclohexanol, ethylene glycol, diethylene glycol, glycerin, etc. are exemplary. These may be used solely or as a combination of two or more thereof.

The amount of these solvents is preferably within a range such that the solid content concentration is not more than 65 mass %, in order to acquire the thickness of film of not less than 20 μm by performing a spin-coating method using the resultant negative photoresist composition. If the solid content concentration is not more than 65 mass %, then it is possible to suppress deterioration of the flowability of the composition and workability, and a uniform resist film can be obtained by a spin-coating method.

In addition to each component in the above, the negative photoresist composition preferably further contains (E) an acid diffusion controlling agent (referred to as "(E) component" hereinafter), if necessary, in order to improve the shape of the resist pattern, and post exposure stability of the latent image formed by the pattern-wise exposure of the resist layer (PED: post exposure delay).

As the (E) component, an arbitrary one can be suitably selected from those which are well known hitherto as acid diffusion controlling agents in chemically amplified resists. In particular, (e1) a nitrogen-containing compound is preferably contained, and further if necessary (e2) an organic carboxylic acid or an oxo acid of phosphorus or a derivative thereof can be contained.

(e1) Nitrogen-Containing Compound:

As the nitrogen-containing compound which is the (e1) component, for example, trimethylamine, diethylamine, triethylamine, di-n-propylamine, tri-n-propyl amine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylendiamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrolidone, N-methylpyrolidone, methylurea, 1,1-dimethylurea, 1,3-dimethylurea, 1,1,3,3-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methyl morpholine, piperazine, 1,4-dimethyl piperazine, 1,4-diazabicyclo[2.2.2]octane, etc. are exemplary.

Among these, particularly an alkanolamine such as triethanolamine is preferable.

Each of these compounds can be used solely or two or more of them can be used in combination.

In general, the (e1) component is used in an amount ranging from 0 to 5 mass % in the case in which the (A) component is set to be 100 mass %, in particular, in an amount ranging from 0 to 3 mass % is preferable.

(e2) Organic Carboxylic Acid, an Oxoacid of Phosphorus or Derivative Thereof:

As the organic carboxylic acid, for example, malonic acid, citric acid, malic acid, succinic acid, benzoic acid, salicylic acid, etc. are preferable, and particularly salicylic acid is preferable.

As the oxoacid of phosphorus or the derivative thereof, phosphoric acid or the derivative thereof such as an ester thereof, such as phosphoric acid, phosphoric acid di-n-butylester, phosphoric acid diphenylester, etc., phosphonic acid and the derivative thereof such as an ester thereof, such as phosphonic acid, phosphonic acid dimethylester, phosphonic acid-di-n-butylester, phenylphosphonic acid, phosphonic acid diphenylester, phosphonic acid dibenzylester, etc., phosphinic acid and the derivative thereof such as an ester thereof, such as phosphinic acid, phenyl phosphinic acid, etc. are exemplary, and among these, phosphonic acid is particularly preferable. Each of these compounds can be used solely or two or more of them can be used in combination.

In general, the (e2) component is used in an amount ranging from 0 to 5 mass % in the case in which the (A) component is set to be 100 mass %, in particular, an amount ranging from 0 to 3 mass % is preferable.

Moreover, against the (e1) component, the (e2) component is preferably used in an amount which is equivalent to that of the (e1) component. This is because the (e2) component and the (e1) component form a salt to be stabilized.

A surface active agent may also be compounded into the negative photoresist composition in order to increase applicability, defoaming performance, leveling performance, etc., if necessary.

As a surface active agent, various activators such as an anion type, a cation type, and a nonion type are exemplary.

For example, fluorine type surface active agents which are commercially available by name (brand name), such as BM-1000, BM-1100 (produced by BM CHEMY Co., Ltd.), MEGAFAC F142D, the same F172, the same F173, the same F183 (made by DAINIPPON INK AND CHEMICALS, Inc.), FLORAD FC-135, the same FC-170C, the same FC-430, the same FC-431 (produced by SUMITOMO 3M Co., Ltd.), SURFLON S-112, the same S-113, the same S-131, the same S-141, the same S-145 (produced by ASAHI GLASS Co., Ltd.) SH-28PA, the same -190, the same -193, SZ-6032, SF-8428 (produced by TORAY SILICONE Co., Ltd.) (brand name), etc. can be used.

The amount of these surface active agents is preferably not more than 5 mass parts to 100 mass parts of the (A) novolac resin.

In order to increase the adhesiveness to the substrate, an adhesive auxiliary may also be contained in the negative photoresist composition.

As an adhesive auxiliary to be used, a functional silane coupling agent is effective. Here, the term "functional silane coupling agent" means a silane coupling agent having a reactive substituent, such as a carboxyl group, a methacryloyl group, an isocyanate group, and an epoxy group, etc., specifically, trimethoxysilyl benzoic acid, γ-methacryloxypropyltrimethoxysilane, vinyl triacetoxysilane, vinyl trimethoxy silane, γ-glycidoxy propyl tri-methoxy silane, β-(3,4-epoxy cyclohexyl) ethyl tri-methoxy silane, etc. are exemplary.

The compounding amount thereof is preferably not more than 20 mass parts per 100 mass parts of the (A) novolac resin.

Moreover, in order to adjust finely the solubility to an alkali developing solution, a monocarboxylic acid, such as acetic acid, propionic acid, n-butyric acid, iso-butyric acid, n-valeric acid, iso-valeric acid, benzoic acid, cinnamic acid, etc.; a hydroxyl monocarboxylic acid, such as lactic acid, 2-hydroxybutyric acid, 3-hydroxybutyric acid, salicylic acid, m-hydroxybenzoic acid, p-hydroxybenzoic acid, 2-hydroxy cinnamic acid, 3-hydroxy cinnamic acid, 4-hydroxy cinnamic acid, 5-hydroxy isophthalic acid, syringi C acid, etc.; a polyvalent carboxylic carboxylic acid, such as oxalic acid, succinic acid, glutaric acid, adipic acid, maleic acid, itaconic acid, hexahydrophthalic acid, phthalic acid, isophthalic acid, terephthalic acid, 1,2-cyclohexane dicarboxylic acid, 1,2,4-cyclohexane tricarboxylic acid, trimellitic acid, pyromellitic acid, cyclopentane tetra carboxylic acid, butane tetra carboxylic acid, 1,2,5,8-naphthalene tetra carboxylic acid, etc.; an acid anhydride such as itaconic anhydride, succinic anhydride, anhydrous citraconic anhydride, dodecenyl succinic anhydride, anhydrous tricarbanil acid, maleic anhydride, hexahydro phthalic anhydride, methyltetrahydro phthalic anhydride, anhydrous Haimic acid (5-norbomene-2,3-dicarboxylic anhydride), 1,2,3,4,-butane tetra carboxylic acid, cyclopentane tetra carboxylic dianhydride, phthalic anhydride, pyromellitic anhydride, trimellitic anhydride, benzophenone tetra carboxylic anhydride, ethylene glycol bis trimellitic anhydride, glycerin tris trimellitic anhydride, etc., may also be added to the negative photoresist composition.

Furthermore, a solvent having high boiling point, such as N-methyl formamide, N,N-dimethyl formamide, N-methyl formanilide, N-methyl acetamide, N,N-dimethyl acetamide, N-methyl pyrolidone, dimethyl sulfoxide, benzyl ethyl ether, dihexyl ether, acetonitrile acetone, isophorone, caproic acid, caprylic acid, 1-octanol, 1-nonanol, benzyl alcohol, benzyl acetate, benzoic ethyl, oxalic ester, diethyl maleate, γ-butyrolactone, ethylene carbonate, propylene carbonate, and phenyl cellosolve acetate, etc. may also be added.

The amount used of the compound for finely adjusting the solubility to an alkali developing solution in the above is not more than 60 mass %, preferably not more than 40 mass % to the composition to be obtained, although the amount can be adjusted corresponding to use or applying method and hence is not limited particularly as long as the compound allows the composition to mix uniformly.

Furthermore, a filler, a colorant, a viscosity adjusting agent, etc. can also be added to the negative photoresist composition, if necessary. As a filler, silica, alumina, talc, bentonite, zirconium silicate, granulated glass, etc. are exemplary.

As a colorant, a loading pigment, such as alumina white, clay, barium carbonate, and barium sulfate, etc.; an inorganic pigment, such as zinc white, white lead, chrome yellow, minium, ultramarine blue, Berlin blue, titanium oxide, chromic acid zinc, red ocher, carbon black, etc.; organic pigment, such as brilliant Carmine 6B, Permanent Red 6B, Permanent Red R, benzidine yellow, copper phthalocyanine blue, Phthalocyanine Green, etc.; a basic dye, such as magenta, rhodamine, etc.; a direct dye, such as direct Scarlett, direct orange, etc.; an acid dye, such as Acid Red 87, metanil yellow, etc. are exemplary.

Moreover, as a viscosity adjusting agent, bentonite, silica gel, aluminium powder, etc. are exemplary. The addition amount of these additives is the range which does not impart the essential performance of the composition, preferably not more than 50 mass % to the composition to be obtained.

Moreover, a defoaming agent and other additives may be added to the negative photoresist composition, if necessary. As a defoaming agent, various silicone type, and fluorine type defoaming agents, etc. are exemplary.

The negative photoresist composition can be prepared by, for example, simply mixing and stirring the each of the above components in an ordinal method, and if necessary, a dispersing apparatus such as a dissolver, a homogenizer, a triple roll mill, etc. may be used to disperse and mix the components. Moreover, after being mixed, the composition may be filtered through a mesh filter, a membrane filter, etc.

The thickness of the (c) layer is 1 μm to 1 mm, preferably 10 μm to 1 mm, more preferably 20 μm to 1 mm, in particular as a single layer the thickness is preferably 20 μm to 150 μm, more preferably 20 to 80 μm, in view of applicability to a thick film. It should be noted that the (c) layer may be either a single layer, or a multiple layers by laminating two or more of layers. The photoresist laminate thus obtained is subjected to a subsequent exposure step.

(Exposure Step)

A selective exposure is performed by irradiating active light, or radioactive rays, such as ultraviolet rays having a wavelength of 300 to 500 nm or visible rays through a predetermined mask pattern, onto the (c) layer of the photoresist laminate obtained in the laminating step. As a radiation source of the active light or radioactive rays, a low-pressure mercury lamp, high-pressure mercury lamp, extra-high-voltage mercury lamp, metal halide lamp, argon gas laser, etc. can be used.

Here, the term "active light" indicates light which activates an acid generating agent in order to generate an acid.

Here, the term "radioactive rays" indicates ultraviolet rays, visible light, far ultraviolet rays, X-rays, electron beams, ionic rays, etc.

The irradiating amount of active light or radioactive rays is, for example, 20 µm in thick, 100 to 3000 mJ/cm$^2$, in the case of using an extra-high-voltage mercury lamp, although it differs depending on the kind of each of components in the negative photoresist composition, the compounding amount of the same, the thickness of the (c) layer, etc.

After the selective exposure is performed in this way, preferably it is subjected to a heating step (PEB treatment), thereby moderately diffusing the acid derived from the acid generating agent.

(Developing Step)

In the developing step, the non-exposed part is dissolved and removed, using an alkali developing solution. At this time, the non-exposed part of the (c) layer dissolves in the developing solution. Then, the (b) layer which exists under the non-exposed part of the (c) layer also comes into contact with the alkali developing solution. And the (b) layer dissolves in the alkali developing solution.

Accordingly, in the developing step, the (b) layer of the non-exposed part and the (c) layer can be developed to be removed simultaneously.

As the developing solution, for example, an aqueous solution of an alkali, such as sodium hydroxide, potassium hydroxide, sodium carbonate, sodium silicate, meta-sodium silicate, ammonia solution, ethylamine, n-propyl amine, diethyl amine, di-n-propyl amine, triethyl amine, methyl diethyl amine, dimethyl ethanol amine, triethanol amine, tetra-methyl ammonium hydroxide (TMAH), tetra-ethyl ammonium hydroxide, pyrrole, piperidine, 1,8-diazabicyclo [5,4,0]-7-undecene, 1,5-diazabicyclo [4,3,0]-5-nonane, etc. can be used, and an aqueous TMAH solution having a concentration of approximately 0.1 to 10 mass % is preferable.

Moreover, an aqueous solution of an alkali in which a suitable amount of water-soluble organic solvents such as methanol and ethanol, and surfactants are added can also be used as the developing solution.

As for the developing method, any method such as a dipping method, paddle method, and spray developing method, can be used.

The developing time is, although it differs depending on conditions, generally approximately 1 to 30 minutes, for example.

It should be noted that what is necessary is that as for the (b) layer and the (c) layer in the developing step, the resist pattern which is obtained in the developing step can be treated such that the (b) layer as well as the (c) layer should be developed, for example, the developing step may be repeated plural times. However, it is preferred that both the (b) layer and the (c) layer be removed in one developing step, in view of ease of the treatment.

After the developing step, preferably it is subjected to washing with running water for 30 to 90 seconds, and to air-dry using an air-gun, etc. or to drying in an oven.

[Process for Producing a Conductor Pattern]

The process for producing a conductor pattern of the present invention includes the step of forming a conductor pattern or a non-resist part (non-exposed part) of the resist pattern which is obtained by the process for producing a conductor pattern of the present invention.

The conductor pattern can be formed by, for example, using gold, copper, nickel, solder, etc.

As the method for forming a conductor pattern, the method for laminating the above (b) layer is exemplary, however, a plating method etc. is also preferable. As the plating method is not particularly limited, various plating methods which are well known hitherto can be used.

Thereby it is possible to form a bump, a metal post, wiring, rewiring, etc.

According to the present invention, the influence to the (c) layer of the copper contained in the (a) layer can be decreased by using the (b) layer.

Moreover, because the (b) layer consists of an inorganic substance, it is possible to form easily a film having stable performance, without strictly controlling and managing in the production, thereby making the controlling and managing in the production easy. Moreover, no mixing against the (c) layer may occur. Moreover, according to the process of the present invention, the (b) layer as well as the (c) layer are developed, thereby making no especial treatment necessary upon being developed, without increasing the number of step.

Thus, the (b) layer can be formed easily, and the (b) layer has stable performance without causing the mixing to the (c) layer, and as a result, the (c) layer is not affected by the (b) layer, thereby enabling the (c) layer to be produced stably.

EXAMPLE

Although examples of the present invention will be explained below, the scope of the present invention is not limited to these examples.

It should be noted that, unless otherwise noted, a part indicates a weight part, and % indicates weight %. The term "degrees of dispersion" indicates a mass average molecular weight/number average molecular weight, in the following example.

Synthesis of the (A) Alkali-Soluble Novolac Resin

Synthesis Example 1 m-cresol and p-cresol were mixed at a mass ratio of 60:40, and then formalin was added thereto, and thereafter the resultant mixture was condensed by an ordinal method using an oxalic acid as a catalyst to obtain a cresol novolac resin. The resultant resin was subjected to a fractionation treatment to eliminate lower molecular domains thereby obtaining an alkali soluble novolac resin having a mass average molecular weight of 15000. This resin is named (A) novolac resin.

Synthesis of (B) Alkali Soluble Acryl Resin

Synthesis Example 2

A flask equipped with a stirrer, a reflux condenser, a thermometer, and a driptank was substituted with nitrogen gas, and thereafter the flask was charged with 200 g of propylene glycol methyl ether acetate as a solvent, and then stirring was started. Thereafter, the temperature of the solvent was elevated to 80° C. The driptank was charged with 0.5 g of 2,2'-azobisisobutyronitrile, 130 g of 2-methoxyethylacrylate, 50.0 g of benzyl methacrylate, and 20.0 g of acrylic acid, and was stirred until the polymerization initiator (brand name V-65, produced by WAKO JUNYAKU Co., Ltd.) was dissolved, and thereafter the resultant solution was uniformly dripped into the flask for 3 hours, then successive polymerization was performed at 80° C. for 5 hours. Thereafter, the reaction solution was cooled to room temperature to obtain an acryl resin. This resin is named (B) an alkali soluble acryl resin.

Example 1

After 75 parts of the (A) novolac resin, 15 parts of the (B) alkali soluble acryl resin, 10 parts of hexamethoxymethylated melamine (brand name of NIKALACK Mw-100 produced by SANWA CHEMICAL Co., Ltd.) as the (C) cross-linking agent, and 0.3 parts of an acid generating agent expressed by the following formula were dissolved in 150 parts of a solvent of propyleneglycol methylether acetate, the resultant mixture was filtered through a membrane filter having pore size of 1.0 μm to prepare a chemically amplified type negative photoresist composition. The resultant composition was evaluated for the performance as shown below, under the conditions shown in Table 1. The result is shown in Table 1.

[chemical 4]

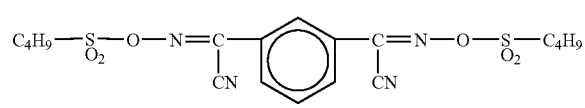

Example 2

A chemically amplified type negative photoresist composition was prepared by the same method as in Example 1, with the exception of using 70 parts of the (A) novolac resin, and 20 parts of the (B) alkali-soluble acryl resin. The resultant composition was evaluated for performance as shown below, under the conditions shown in Table 1. The result is shown in Table 1.

Example 3

A chemically amplified type negative photoresist composition was prepared by the same method as in Example 1, with the exception of using 80 parts of the (A) novolac resin, and 10 parts of the (B) alkali-soluble acryl resin. The resultant composition was evaluated for performance as shown below, under the conditions shown in Table 1. The result is shown in Table 1.

Example 4

A chemically amplified type negative photoresist composition was prepared by the same method as in Example 1, with the exception of using 15 parts of an alkali-soluble vinyl ethyl ether polymer which was obtained by performing a gaseous phase high temperature high pressure polymerization of the (B) plasticizer with ethylvinylether in the presence of a catalyst. The resultant composition was evaluated for performance as shown below, under the conditions shown in Table 1. The result is shown in Table 1.

Example 5

A chemically amplified type negative photoresist composition was prepared by the same method as in Example 1, with the exception of using 15 parts of an alkali soluble vinyl methyl ether polymer which was obtained by performing a gaseous phase high temperature high pressure polymerization of the (B) plasticizer with ethylvinylether in the presence of a catalyst. The resultant composition was evaluated for performance as shown below, under the conditions shown in Table 1. The result is shown in Table 1.

Examples 6-11

The same chemically amplified type negative photoresist composition as in Example 1 was evaluated for performance as shown below, under the conditions shown in Table 1. The result is shown in Table 1.

Comparative Example 1

(b) No Inorganic Substance Layer

When the same operation was performed as in Example 1 without the (b) inorganic substance layer, it was revealed that the (a) support was affected such that the lower part of the resist pattern being in contact with the (a) support became thicker than the upper part of the resist pattern, or the resist pattern was insufficient and could not be developed. The result is shown in Table 1.

Comparative Example 2

Shielding Layer

Preparation of the Shielding Layer Material

Synthesis Example 3

3 g of 4,4'-bis(diethylamino)benzophenone as an ultraviolet absorbing agent, 5 g of a melamine derivative (produced by SANWA CHEMICAL Co., Ltd., Mx-750) in which an average of 3.7 methoxymethyl groups are substituted per one melamine ring as a crosslinking agent, and 5 g of 2,2,4,4'-tetrahydroxybenzophenone were dissolved in 150 g of propyleneglycol-monomethyletheracetate, in addition, 1000 ppm of a fluorine type surfactant (produced by SUMITOMO 3M Co., Ltd., Fc-430) was dissolved thereinto, and thereafter the resultant solution mixture was filtered through a membrane filter with a pore size of 0.2 μm to prepare a shielding layer material.

When the same treatment as in Example 1 was performed except that the shielding layer material in Synthesis Example 3 was applied to a 5-inch copper sputtering wafer, and then it was heated at 150° C. for 10 minutes to form a (b) shielding layer with a predetermined thickness, it was revealed that the (a) support was affected due to the mixing of the (b) layer and the (c) layer such that that the lower part of the resist pattern being in contact with the (a) support became thicker than upper part of the resist pattern, or the resist pattern was insufficient and could not be developed. The result is shown in Table 1. It should be noted that the notation "note" in Table 1 indicates that the shielding layer was formed with a material other than an inorganic substance.

Comparative Example 3

Shielding Layer

When the same treatment as in Example 1 was performed except that the shielding layer material in Synthesis Example 3 was applied to a 5-inch copper sputtering wafer, and then it was heated at 200° C. for 10 minutes to form a (b) shielding layer with a predetermined thickness, it was revealed that the (b) shielding layer could not developed. The evaluation result is shown in Table 1. It should be noted that the notation "note" in Table 1 indicates that the shielding layer was formed with a material other than inorganic substance.

Comparative Example 4

Copper Oxide Film

A (a) 5-inch copper sputtering wafer was baked at 300° C. for 20 minutes to form a copper oxide film on the wafer. The thickness of the copper oxide film on the wafer was measured by a cross section SEM, and as a result, it was confirmed that the thickness of the film was at least 3000 Å. When the same treatment as in Example 1 was performed other than this, it was revealed that the (b) shielding layer could not developed. The evaluation result is shown in Table 1.

[Performance Evaluation]—Developing Ability

A (b) layer with a specific thickness was formed onto (a) a 5-inch copper sputtering wafer, using a specific (b) inorganic substance target through a sputtering method. And thereafter, each of the components was applied thereto at 1800 rpm for 25 seconds, such that the thickness became approximately 20 μm, using a spinner, and then the resultant wafer was subjected to a prebaking at 110° C. for 6 minutes on a hot plate to form a photoresist laminate.

As for a coated film with a thickness of approximately 120 μm, application was performed at 800 rpm for 25 seconds, and thereafter prebaking was performed at 110° C. for 1 minute on a hot plate, and further application was performed at 500 rpm for 25 seconds, and then prebaking was performed at 110° C. for 20 minutes to form a photoresist laminate.

As for a coated film with a thickness of approximately 500 μm, application was performed such that the thickness of the film after being dried became approximately 500 μm, using an applicator, and thereafter prebaking was performed at 120° C. for 2 hours to form a photoresist laminate.

To each of the above thick photoresist laminates thus obtained, ultraviolet-ray exposure was performed stepwisely within a range of 100 to 10,000 mJ/cm², using a stepper (made by Nikon Co., Ltd., model NSR-2005i10D) through a pattern mask for measuring resolution. After the exposure, each laminate was heated at 70° C. for 5 minutes, and thereafter the resultant laminate was developed with a developing solution (brand name PMER SERIES, P-7G, produced by TOKYO OHKA KOGYO Co., Ltd.).

Thereafter, each laminate was washed with running water, then subjected to nitrogen blowing to obtain a pattern like cured material. This cured material was observed by a microscope and the developing ability was evaluated in accordance with the following evaluation standard.

O: A state in which the (b) layer and the (c) layer of the exposed part were developed, whereas both the (b) layer and the (c) layer of non-exposed part were not developed.

X: A state in which the (b) layer and the (c) layer of the exposed part were not developed, alternatively the (b) layer of non-exposed part or the (c) layer of non-exposed part was developed.

Heat Stability

Using the substrate having the pattern like cured material obtained in the above "developing and resolution evaluation" as test piece, the stability after the prebaking and developing treatment of the (b) layer and the (c) layer were evaluated in accordance with the following evaluation standard:

O: No mixing could be seen in both the (b) layer and the (c) layer, and hence it is stable.

X: Mixing could be seen in both the (b) layer and the (c) layer.

Shape of Bumps

Using the substrate having the pattern like cured material obtained in the above "developing and resolution evaluation" as test piece, ashing treatment was performed with oxygen plasma, and thereafter the resultant test pieces were immersed in a copper sulfate plating solution at 23° C. for 30 minutes, then washed with running water to obtain treated test pieces. The state of the formed bump and the pattern like cured material were observed by an optical microscope or an electron microscope to evaluate the shape of the formed bumps in accordance with the following evaluation standard:

O: The shape of bump depends (follows) on the pattern like cured material, and hence it is good.

X: The shape of bump does not depend on the pattern like cured material, and swells.

Each of the negative photoresist compositions prepared in Examples 1 to 11, and Comparative Examples 1 to 4 was evaluated by performing each above test thereon. It should be noted that in the evaluating method, as to Comparative Examples 1 to 4, it differs only in that no shielding layer is formed, or, that no inorganic substance layer which consists of the inorganic substance supplied from the inorganic substance source which is essential for the present invention, is formed.

TABLE 1

|  | Examples | | | | | | | Comparative Examples | | | |
| --- | --- | --- | --- | --- | --- | --- | --- | --- | --- | --- | --- |
|  | 1-6 | 7 | 8 | 9 | 10 | 11 | 12 | 1 | 2 | 3 | 4 |
| Thickness of (c) layer | 20 μm | 20 μm | 20 μm | 120 μm | 500 μm | 20 μm | 20 μm | 20 μm | 20 μm | 20 μm | 20 μm |
| Thickness of (b) layer | 1 nm | 50 nm | 1 μm | 50 nm | 50 nm | 50 nm | 50 nm | — | 50 nm | 50 nm | 300 nm |
| (b) Inorganic substance | Al | Al | Al | Al | Al | Mo | Zn | — | note | note | CuO |
| Developability | O | O | O | O | O | O | O | X | X | X | X |
| Heat stability | O | O | O | O | O | O | O | — | X | O | O |
| Shape of bump | O | O | O | O | O | O | O | — | — | — | — |

INDUSTRIAL APPLICABILITY

The present invention is applicable to a process for producing a resist pattern and a conductor pattern.

The invention claimed is:

1. A process for producing a resist pattern comprising:
   laminating (a) a support having an upper surface comprising copper, (b) an inorganic substance layer consisting of an inorganic substance supplied from an inorganic substance source, and (c) a photoresist layer consisting of a chemically amplified type negative photoresist composition, to obtain a photoresist laminate, wherein the inorganic substance is at least one selected from the group consisting of Al, Zn, Mo, Sn, Pb, and indium-tin oxide (ITO);

selectively irradiating active light or radioactive rays to said photoresist laminate; and developing said (c) photoresist layer together with said (b) inorganic substance layer to form a resist pattern.

2. The process for producing a resist pattern as set forth in claim 1, wherein the thickness of the (b) inorganic substance layer is 0.05 nm to 1 µm.

3. The process for producing a resist pattern as set forth in claim 1, wherein the thickness of the (c) photoresist layer is 10 µm to 1 mm.

4. The process for producing a resist pattern as set forth in claim 1, wherein the inorganic substance source supplies Al to form the (b) inorganic substance layer which contains Al, by at least one method selected from a sputtering method, vapor deposition method, and plating method.

5. The process for producing a resist pattern as set forth in claim 1, wherein the chemically amplified type negative photoresist composition contains (A) a novolac resin, (B) a plasticizer, (C) a cross linking agent, and (D) an acid generating agent.

6. A process for producing a conductor pattern comprising forming a conductive pattern on the non-resist part of the resist pattern obtained by the process for forming a resist pattern as set forth in claim 1.

* * * * *

UNITED STATES PATENT AND TRADEMARK OFFICE
CERTIFICATE OF CORRECTION

PATENT NO.        : 7,871,758 B2
APPLICATION NO.   : 11/720176
DATED             : January 18, 2011
INVENTOR(S)       : Koichi Misumi, Koji Saito and Kaoru Ishikawa It is certified that error appears in the above-identified patent and that said Letters Patent is hereby corrected as shown below:

Col. 10, lines 47-48, change "(4-methoxyphenyl)phenyliodoniumtrifluoromehanesulfonate," to --(4-methoxyphenyl)phenyliodoniumtrifluoromethanesulfonate,--.

Col. 10, line 55, change "phenylziazonium" to --phenylzitazonium--.

Col. 11, line 34, change "2-methyl3" to --2-methyl-3--.

Col. 12, line 25, change "hexamethylendiamine," to --hexamethylenediamine,--.

Col. 12, line 30, change "pyrolidone, N-methylpyrolidone," to --pyrrolidone, N-methylpyrrolidone,--.

Col. 12, line 33, change "4-methyimidazole," to --4-methylimidazole,--.

Col. 13, line 13, change "CHEMY" to --CHEMIE--.

Col. 13, line 16, change "FLORAD" to --FLUORAD--.

Col. 13, line 49, change "syringi C acid," to --syringic acid,--.

Col. 13, line 61, change "Haimic" to --Humic--.

Col. 13, line 61, change "norbomene" to --norbornene--.

Col. 14, line 4, change "pyrolidone," to --pyrrolidone,--.

Col. 14, line 35 (approx.) change "impart" to --impar--.

Signed and Sealed this
Ninth Day of August, 2011

David J. Kappos
*Director of the United States Patent and Trademark Office*